(12) United States Patent
Lipinski

(10) Patent No.: US 7,223,525 B2
(45) Date of Patent: May 29, 2007

(54) PROCESS FOR GENERATING A HARD MASK FOR THE PATTERNING OF A LAYER

(75) Inventor: Matthias Lipinski, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/970,483

(22) Filed: Oct. 21, 2004

(65) Prior Publication Data

US 2005/0106478 A1    May 19, 2005

(30) Foreign Application Priority Data

Oct. 24, 2003   (DE) ................. 103 49 764

(51) Int. Cl.
*G03F 7/20* (2006.01)
*G03F 7/40* (2006.01)
*B05D 5/00* (2006.01)
*C23C 28/00* (2006.01)

(52) U.S. Cl. .............. 430/311; 430/313; 430/316; 427/96.2; 427/160

(58) Field of Classification Search ........... 430/313, 430/316, 311; 427/96.2, 160
See application file for complete search history.

(56) References Cited

U.S. PATENT DOCUMENTS

| | | | | |
|---|---|---|---|---|
| 5,753,418 A | * | 5/1998 | Tsai et al. | 430/313 |
| 6,025,117 A | * | 2/2000 | Nakano et al. | 430/314 |
| 6,296,780 B1 | * | 10/2001 | Yan et al. | 216/67 |
| 6,420,097 B1 | * | 7/2002 | Pike et al. | 430/313 |
| 6,423,797 B1 | * | 7/2002 | Hong et al. | 526/204 |
| 6,573,030 B1 | * | 6/2003 | Fairbairn et al. | 430/323 |
| 6,730,454 B2 | * | 5/2004 | Pfeiffer et al. | 430/270.1 |
| 2002/0128410 A1 | * | 9/2002 | Jung et al. | 526/219.6 |

* cited by examiner

*Primary Examiner*—Mark F. Huff
*Assistant Examiner*—John Ruggles
(74) *Attorney, Agent, or Firm*—Laurence A. Greenberg; Werner H. Stemer; Ralph E. Locher

(57) ABSTRACT

A process for generating a hard mask for the patterning of a first layer includes applying a second layer, which includes carbon, to the first layer that is to be patterned. A third layer, which includes silicon and carbon, is spun onto the second layer and an organic antireflection coating layer that is to be used with an overlying photoresist layer patternable using 193 nm technology, is appllied to the spun-on third layer.

6 Claims, 1 Drawing Sheet

PROCESS FOR GENERATING A HARD MASK FOR THE PATTERNING OF A LAYER

BACKGROUND OF THE INVENTION

Field of the Invention

The present invention relates to a process for generating a hard mask for the patterning of a layer, and a hard mask for the patterning of the layer.

Nowadays, a wide range of configurations of hard masks are used to form microelectronic patterns. A layer sequence of a known type of hard mask for the patterning of a first layer 10, for example of silicon nitride, is illustrated with reference to FIG. 2. Above the first layer 10 there is disposed a layer 11 that primarily contains carbon and is applied by physical vapor deposition (PVD) or plasma-enhanced chemical vapor deposition (PECVD). The carbon-based layer 11 has a thickness of, for example, a few 100 nm. Above the carbon-based layer 11, a silicon-based layer 12, which includes SiON, SiC or other materials rich in silicon, is applied, likewise using a PECVD step. The silicon-based layer 12 is relatively thin compared to the carbon-based layer 11, for example with a thickness of a few 10 nm.

A photoresist 13 or resist above the silicon-based layer 12 is photolithographically patterned in order for the layers 12, 11 and 10 below to be provided with a corresponding pattern. A non-illustrated lithographic pattern in the photoresist 13 is introduced into the silicon-based layer 12 by use of a fluorine-based etching process. Then, the photoresist layer 13 can be removed. As a result, the lithographic pattern has been transferred into the silicon-based layer 12, and the silicon-based layer becomes a mask for the patterning of the thick carbon-based layer 11. The thick carbon-based layer 11 is then used to pattern a wide range of further materials of the layer 10 in order to produce microelectronic devices.

The combination of a silicon-based mask 12 of this type with a carbon-based mask 11 is expedient since the carbon-based mask 11 can be etched using an oxygen plasma. An etching process using an oxygen plasma converts the silicon-based mask into nonvolatile silicon dioxide which has a high etching resistance. In the case of the known layer sequence shown in FIG. 2, the optical properties of the silicon-based layer 12 can be set in such a manner that this material serves as an antireflection coating layer, in order to allow the formation of lithographic patterns in the resist layer 13 on the silicon-based layer 12. In practice, however, it has emerged that this only applies to resist layers 13 used for 248 nm technology. With modern 193 nm technology, the photoresist layer 13 cannot be used as a dielectric antireflection coating with the silicon-based layer 12 deposited in a PECVD step.

Serious imprints or residues (footings) occur on account of an interaction between the PECVD-deposited silicon-based layer 12 and the photoresist material of the layer 13. To avoid these undesirable residues (footings), it is known to apply an additional non-illustrated organic antireflection coating layer to the dielectric antireflection coating, i.e. the silicon-based layer 12, which has been deposited in a PECVD step before the photoresist 13 is deposited thereon. However, this makes a hard mask generated in this way more complex and expensive.

SUMMARY OF THE INVENTION

It is accordingly an object of the invention to provide a process for generating a hard mask for the patterning of a layer, and a hard mask for the patterning of the layer which overcomes the above-mentioned disadvantages of the prior art devices and methods of this general type, which employs a simple and inexpensive procedure.

With the foregoing and other objects in view there is provided, in accordance with the invention, a hard mask for patterning a first layer. The hard mask contains a second layer disposed on the first layer to be patterned and the second layer contains carbon. A third layer is spun onto the second layer and contains silicon and carbon. An organic antireflection coating layer is disposed on the third layer.

The idea on which the present invention is based substantially relates to a silicon-based layer, which is applied using the PECVD process, being replaced by a silicon-containing layer which is spun on, as well as an organic antireflection coating layer which is spun onto the silicon-containing layer. It is in this way possible to avoid both the expensive tools required for a PECVD step and the time-consuming and complex deposition step itself.

The problem on which the present object is based is solved in particular by virtue of the provision of a process for generating a hard mask for the patterning of the first layer. A second layer, which includes carbon, is applied to the first layer, which is to be patterned. A third layer, which includes silicon and carbon, is spun onto the second layer and an organic antireflection coating layer is applied to the third layer.

According to a preferred refinement, the organic antireflection coating layer is likewise spun on.

According to a further preferred refinement, during subsequent patterning of the first layer, which is to be patterned, the next, organic antireflection coating layer and the spun-on third layer are lithographically patterned using a first etchant.

According to a further preferred refinement, the second layer is patterned using a second etchant, the pattern of the organic antireflection coating layer and of the spun-on third layer as mask, before the layer that is to be patterned is patterned using the resulting patterned hard mask.

According to a further preferred refinement, the first etchant is fluorine-based and the second etchant is oxygen-based.

According to a further preferred refinement, the second layer has a carbon content of more than 50%.

According to a further preferred refinement, the second layer is more than twice as thick, preferably more than eight times as thick, as the spun-on third silicon-carbon layer.

Other features which are considered as characteristic for the invention are set forth in the appended claims.

Although the invention is illustrated and described herein as embodied in a process for generating a hard mask for the patterning of a layer, and a hard mask for the patterning of the layer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
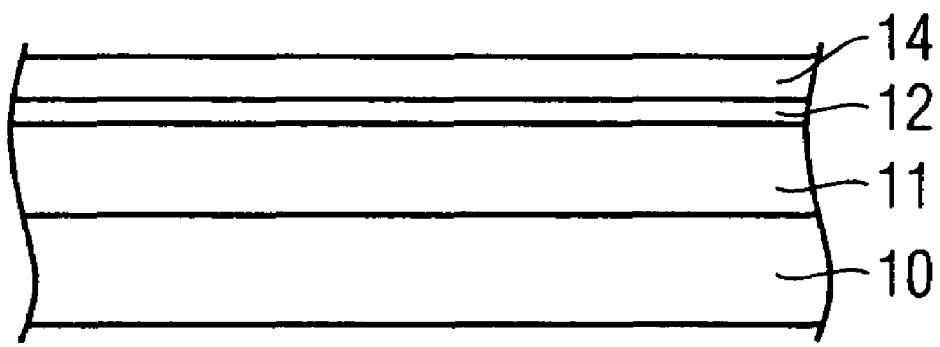
FIG. 1 is a diagrammatic, cross-sectional view through a hard mask for explaining an embodiment according to the invention.
Figure 2:
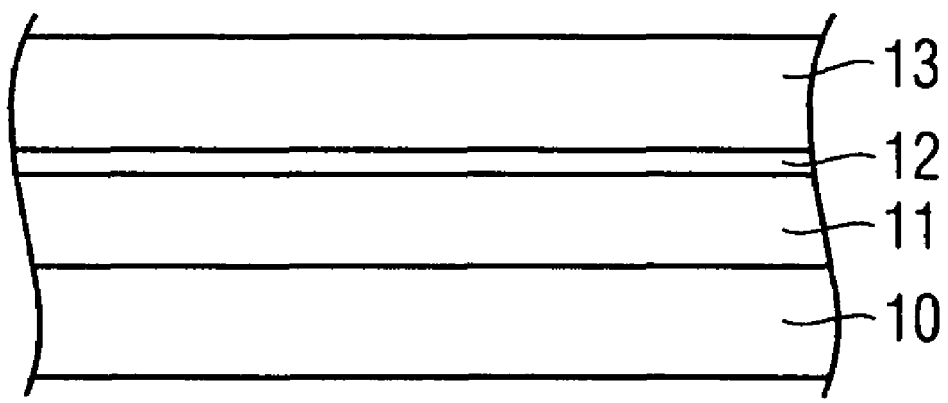
FIG. 2 shows a diagrammatic, cross-sectional view for explaining a hard mask according to the prior art.

In all the figures of the drawing, sub-features and integral parts that correspond to one another bear the same reference symbol in each case. Referring now to the figures of the drawing in detail and first, particularly, to FIG. 1 thereof, there is shown an illustration of a hard mask 11, 12, 14 for patterning a first layer 10, which is produced as follows. A layer 11, which preferably contains more than 50% carbon, is applied to the first layer 10 that is to be patterned and includes, for example, silicon nitride or lithium. The carbon-containing layer 11 is deposited on the layer 10 that is to be patterned by, for example, PVD or PECVD, and preferably has a thickness of several 100 nm. An organic, i.e. carbon-containing, silicon material is spun on above the carbon-containing layer 11 in a layer 12 in a spin-on step. A suitable material for the layer 12 in this context is, for example, a material which is used as bottom resist in lithographic two-layer systems, it being possible to use any silicon-containing spin-on material.

In a further process step, a carbon-containing, i.e. organic, antireflection coating layer 14 is spun onto the spun-on silicon-containing layer 12. If a non-illustrated photoresist layer, applied above the carbon-containing antireflection coating layer 14, is photolithographically patterned, the organic antireflection coating layer 14 can preferably be patterned using the same fluorine-based etching chemistry or etchant as the spun-on silicon-containing layer 12. After removal of the photoresist or resist, the etching chemistry or etchant is preferably switched over to etching chemistry based on oxygen plasma. This makes it possible for the silicon in the spun-on layer 12 to be converted into non-volatile silicon dioxide if the carbon-containing layer 11 is patterned accordingly. This uncovers the layer 10 that is actually to be patterned, and the layer can be patterned in accordance with the patterned hard mask 11, 12, 14. The silicon-containing layer 12 is therefore applied in situ with the application of the organic antireflection coating layer 14. This in-situ spin-on application is significantly less expensive than a PECVD process.

Although the present invention has been described above on the basis of a preferred exemplary embodiment, it is not restricted to this embodiment, but rather can be modified in numerous ways. For example, consideration may in principle be given to patterning of any material using a hard mask. Moreover, the dimensions given for the layers 11, 12 and their additional components are to be regarded merely as examples.

This application claims the priority, under 35 U.S.C. § 119, of German patent application No. 103 49 764.1, filed Oct. 24, 2003; the entire disclosure of the prior application is herewith incorporated by reference.

I claim:

1. A process for generating a hard mask for pattetning a first layer, which comprises the steps of:
    applying a second layer containing carbon, to the first layer, which is to be patterned;
    spinning a third layer containing silicon and carbon, onto the second layer; and
    applying an organic antireflection coating layer to the third layer, the antireflection coating layer to be used with an overlying photoresist layer that is patternable using 193 nm technology.

2. The process according to claim 1, which further comprises spinning the organic antireflection coating layer onto the third layer.

3. The process according to claim 1, which further comprises during subsequent patterning of the first layer, lithographically patterning the organic antireflection coating layer and the third layer using an etchant.

4. The process according to claim 3, which further comprises patterning the second layer using a further etchant, a pattern of the organic antireflection coating layer and of the third layer functioning as a mask, before the first layer which is to be patterned is patterned using the hard mask.

5. The process according to claim 4, which further comprises using a fluorine-based etchant as the etchant and an oxygen-based etchant as the further etchant.

6. The process according to claim 1, which further comprises:
    applying a photoresist layer above the organic antireflection coating layer; and
    patterning the photoresist layer using 193 nm technology.

* * * * *